US011003530B2

(12) United States Patent
Jeong et al.

(10) Patent No.: US 11,003,530 B2
(45) Date of Patent: May 11, 2021

(54) SEMICONDUCTOR APPARATUS

(71) Applicant: SK hynix Inc., Icheon-si (KR)

(72) Inventors: Hyeong Soo Jeong, Icheon-si (KR); Gang Sik Lee, Anyang-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/587,553

(22) Filed: Sep. 30, 2019

(65) Prior Publication Data

US 2020/0192755 A1 Jun. 18, 2020

(30) Foreign Application Priority Data

Dec. 13, 2018 (KR) ........................ 10-2018-0160954

(51) Int. Cl.
*G11C 29/00* (2006.01)
*G06F 11/10* (2006.01)
*G11C 17/18* (2006.01)
*G11C 17/16* (2006.01)

(52) U.S. Cl.
CPC .......... *G06F 11/1068* (2013.01); *G11C 17/16* (2013.01); *G11C 17/18* (2013.01)

(58) Field of Classification Search
CPC ...... G06F 11/1068; G11C 17/16; G11C 17/18
See application file for complete search history.

(56) References Cited

U.S. PATENT DOCUMENTS

2007/0033449 A1* 2/2007 Hwang ................ G11C 29/021 714/710
2019/0179701 A1 6/2019 Lee

FOREIGN PATENT DOCUMENTS

KR 1020140050975 A 4/2014
KR 1020140099689 A 8/2014

* cited by examiner

*Primary Examiner* — Samir W Rizk
(74) *Attorney, Agent, or Firm* — William Park & Associates Ltd.

(57) ABSTRACT

A semiconductor apparatus includes a fuse array, storage circuit, parity circuit, fuse data register, parity data register, and error correction circuit. The fuse array stores information about fail addresses and outputs the stored information as fuse data during a boot-up operation. Wherein, the storage circuit stores the fuse data and outputs it as a storage signal and the parity circuit performs a parity operation based on the storage signal and outputs a result of the parity operation as a parity signal, the fuse data register receives and stores the fuse data and outputs the stored data as a fuse register output signal. The parity data register receives and stores the parity signal and outputs the stored information as a parity register output signal, the error correction circuit corrects an error of the fuse register output signal based on the parity register output signal and outputs the error-corrected signal as repair information.

13 Claims, 3 Drawing Sheets

1000

100 FUSE ARRAY
F_data
200 STORAGE CIRCUIT
S_s
300 PARITY CIRCUIT
P_s
400 FUSE DATA REGISTER
500 PARITY DATA REGISTER
F_r
P_r
600 ERROR CORRECTION CIRCUIT
Rep_inf

SEMICONDUCTOR APPARATUS

CROSS-REFERENCES TO RELATED APPLICATION

The present application claims priority under 35 U.S.C. § 119(a) to Korean application number 10-2018-0160954, filed on Dec. 13, 2018, in the Korean Intellectual Property Office, which is incorporated herein by reference in its entirety.

BACKGROUND

1. Technical Field

Various embodiments of the present disclosure relate to a semiconductor integrated circuit and, more particularly, to a semiconductor apparatus.

2. Related Art

A memory apparatus includes a plurality of arrayed memory cells. The memory apparatus cannot operate normally when defects occur in some of the great number of memory cells.

There is an increasing possibility of defects in the memory cells due to higher density of integration for the memory apparatus, and research is currently being conducted for repairing memory cells having defects.

SUMMARY

In an embodiment of the present disclosure, a semiconductor apparatus may include a fuse array, a storage circuit, a parity circuit, a fuse data register, a parity data register, and an error correction circuit. The fuse array may be configured to store information about failed addresses and to output the stored information as fuse data during a boot-up operation. The storage circuit may be configured to store the fuse data and to output the stored fuse data as a storage signal. The parity circuit may be configured to perform a parity operation based on the storage signal and to output a result of the parity operation as a parity signal. The fuse data register may be configured to receive and store therein the fuse data and to output the stored fuse data as a fuse register output signal. The parity data register may be configured to receive and store therein the parity signal and to output the stored parity signal as a parity register output signal. The error correction circuit may be configured to correct an error of the fuse register output signal based on the parity register output signal and to output the error-corrected signal as repair information.

In an embodiment of the present disclosure, a semiconductor apparatus may include a boot-up control circuit, a fuse array, a fuse data register, a parity data register, a selective input circuit, a storage circuit, a parity circuit, and an error correction circuit. The boot-up control circuit may be configured to generate a fuse address and a fuse clock during a boot-up operation. The fuse array may include a plurality of fuse sets in which failed address information is stored, and may be configured to output the failed address information stored in the plurality of fuse sets as fuse data based on the fuse address. The selective input circuit may be configured to input the fuse data to the fuse data register or to input a parity signal to the parity data register based on a selection signal. The storage circuit may be configured to receive and store therein the fuse data based on a counting code and to output the stored fuse data as a storage signal to the parity circuit. The parity circuit may be configured to perform a parity operation based on the storage signal and to output a result of the parity operation as the parity signal. The error correction circuit may be configured to generate repair information based on an output of the fuse data register and an output of the parity data register.

BRIEF DESCRIPTION OF THE DRAWINGS

Features, aspects, and embodiments are described in conjunction with the attached drawings.

DETAILED DESCRIPTION

Hereinafter, a semiconductor apparatus according to the present disclosure is described with reference to the accompanying drawings.

Figure 1:
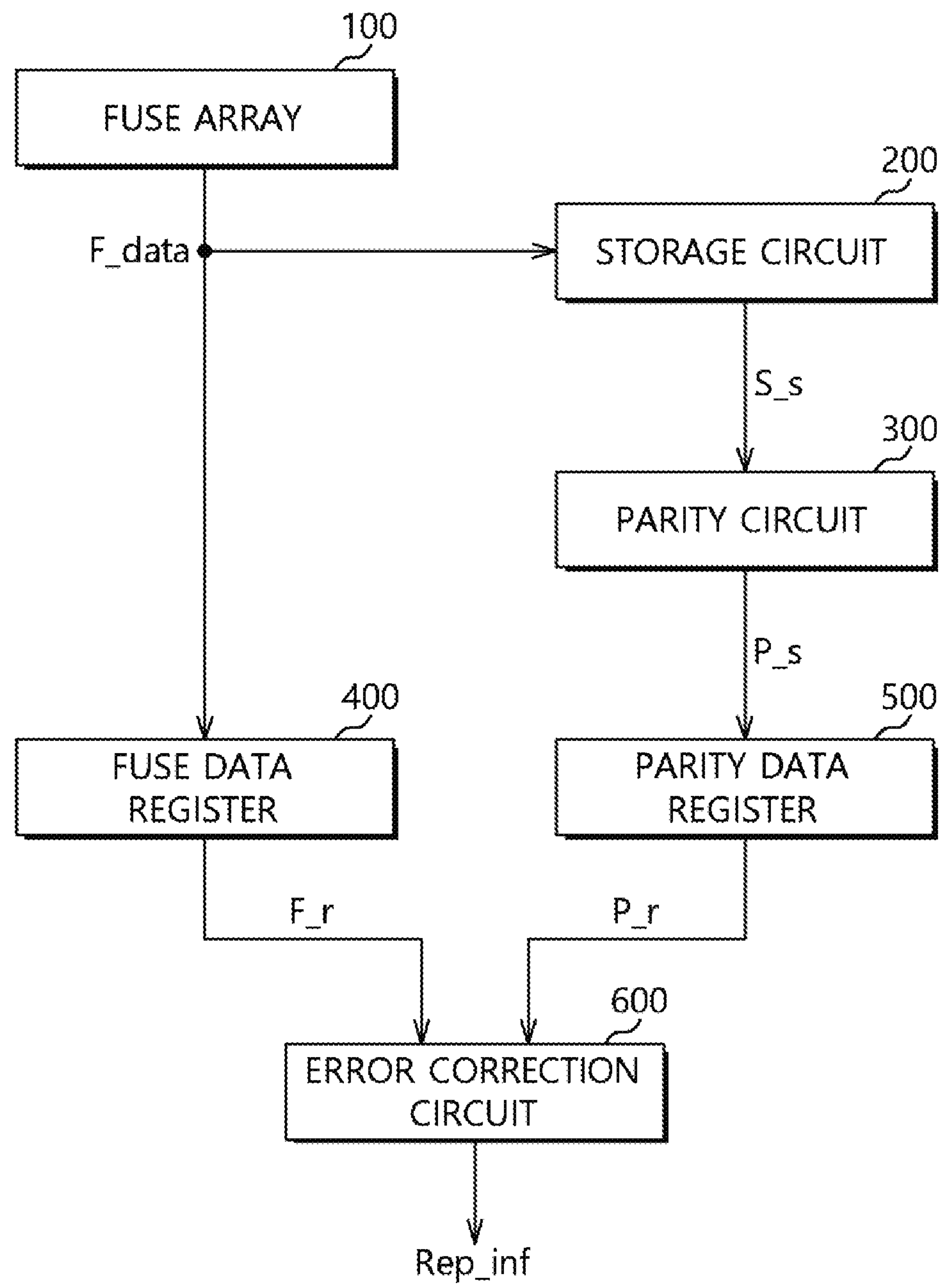
FIG. 1 is a diagram illustrating a configuration of a semiconductor apparatus, in accordance with an embodiment.

FIG. 1 is a diagram illustrating a configuration of a semiconductor apparatus 1000, in accordance with an embodiment.

Referring to FIG. 1, the semiconductor apparatus 1000 may include a fuse array 100, a storage circuit 200, a parity circuit 300, a fuse data register 400, a parity data register 500, and an error correction circuit 600.

The fuse array 100 may include a plurality of fuse sets. The fuse array 100 may store, into the plurality of fuse sets, information of bits of all failed addresses, respectively. The failed addresses may be addresses which point to memory locations in which failure occurs. The fuse array 100 may output the stored information as fuse data F_data during a boot-up operation. Each of the plurality of fuse sets may be an electrical fuse (E-fuse), in which information is programmed by overcurrent fuse melting.

The storage circuit 200 may receive and store therein the fuse data F_data provided from the fuse array 100. The storage circuit 200 may output the stored information as a storage signal S_s.

The parity circuit 300 may receive the storage signal S_s provided from the storage circuit 200 and may perform a parity operation to the storage signal S_s. The parity circuit 300 may output a result of the parity operation as a parity signal P_s.

The fuse data register 400 may receive and store therein the fuse data F_data provided from the fuse array 100. The fuse data register 400 may output the stored information as a fuse register output signal F_r.

The parity data register 500 may receive and store therein the parity signal P_s provided from the parity circuit 300. The parity data register 500 may output the stored information as a parity register output signal P_r.

The error correction circuit 600 may receive the fuse register output signal F_r provided from the fuse data register 400 and the parity register output signal P_r provided from the parity data register 500. The error correction circuit 600 may correct an error of the fuse register output signal F_r based on the parity register output signal P_r. The error correction circuit 600 may output the error-corrected fuse register output signal F_r as repair information Rep_inf.

An operation of the semiconductor apparatus 1000 of such structure in accordance with an embodiment may be as follows.

The fuse array 100 may store therein information about all of the failed addresses, and may output the stored information as the fuse data F_data to the storage circuit 200 and the fuse data register 400.

The storage circuit 200 may receive and store therein the fuse data F_data, and may output the stored information as the storage signal S_s to the parity circuit 300. The storage circuit 200 may output the stored information, an amount of which is suitable for the parity circuit 300 to perform the parity operation, as the storage signal S_s to the parity circuit 300. For example, when a size of the fuse data F_data is greater than a process capacity of the parity circuit 300, the storage circuit 200 may divide the stored fuse data F_data and output the divided information as the storage signal S_s to the parity circuit 300. When the size of the fuse data F_data is smaller than a process capacity of the parity circuit 300, the storage circuit 200 may store additional fuse data F_data and then may output the stored information as the storage signal S_s to the parity circuit 300.

The parity circuit 300 may perform the parity operation on the provided storage signal S_s and may output the result of the parity operation as the parity signal P_s.

The fuse data register 400 may receive and store therein the fuse data F_data provided from the fuse array 100, and may output the stored information as the fuse register output signal F_r.

The parity data register 500 may receive and store therein the parity signal P_s provided from the parity circuit 300, and may output the stored information as the parity register output signal P_r.

The error correction circuit 600 may correct an error of the fuse register output signal F_r based on the parity register output signal P_r, and may output the error-corrected information as the repair information Rep_inf.

In accordance with an embodiment, the semiconductor apparatus 1000 may increase an operation speed of the repair operation because the fuse array 100 including the electrical fuse (E-fuse) operates slow and therefore all information of the failed addresses programmed in the fuse array 100 can be stored in the fuse data register 400 during the boot-up. Further, repair reliability of the semiconductor apparatus 1000 may be increased because the parity operation is performed to the information of the failed addresses programmed in the fuse array 100 and all of the result of the parity operation is stored in the parity data register 500 during the boot-up operation, and the information stored in the fuse data register 400 is error-corrected on a basis of the information stored in the parity data register 500 and the result of the error correction is output as the repair information Rep_inf.

Consequently, in accordance with an embodiment, the semiconductor apparatus 1000 may increase the operation speed and the reliability of the repair operation.

Figure 2:
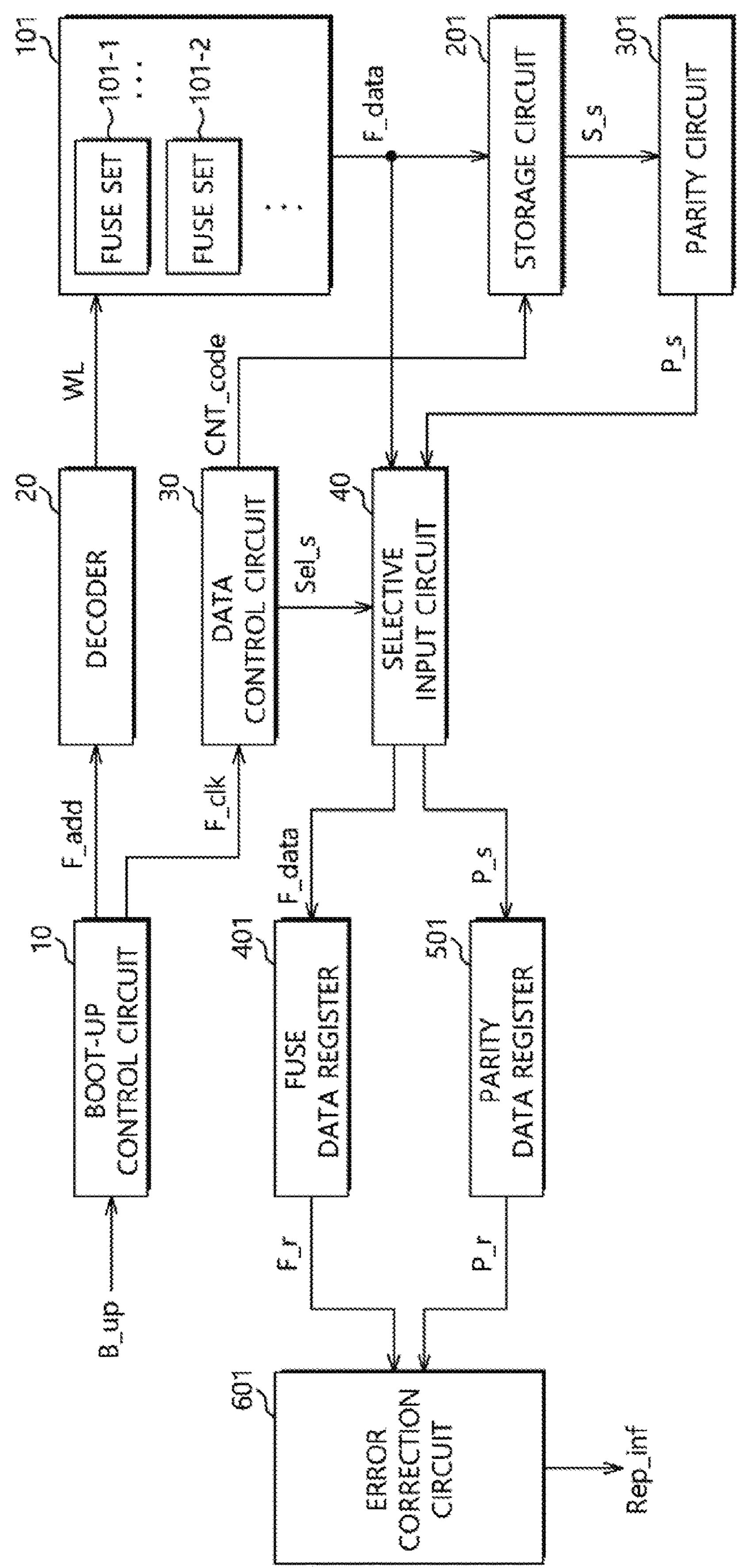
FIG. 2 is a diagram illustrating a configuration of a semiconductor apparatus, in accordance with an embodiment.

FIG. 2 is a diagram illustrating a configuration of a semiconductor apparatus 2000, in accordance with an embodiment.

Referring to FIG. 2, the semiconductor apparatus 2000 may include a boot-up control circuit 10, a decoder 20, a data control circuit 30, a selective input circuit 40, a fuse array 101, a storage circuit 201, a parity circuit 301, a fuse data register 401, a parity data register 501, and an error correction circuit 601.

The boot-up control circuit 10 may generate a fuse address F_add and a fuse clock F_clk. The boot-up control circuit 10 may generate the fuse address F_add and the fuse clock F_clk based on a boot-up signal B_up. The boot-up control circuit 10 may generate the fuse clock F_clk, which periodically transits while the boot-up signal B_up is enabled. The boot-up control circuit 10 may generate a counting code sequentially increasing by counting the fuse clock F_clk while the the boot-up signal B_up is enabled, and may output the counting code as the fuse address F_add.

The decoder 20 may perform a decoding operation by receiving the fuse address F_add provided from the boot-up control circuit 10. The decoder 20 may enable word lines WL based on a result of the decoding operation. For example, the decoder 20 may enable a word line WL corresponding to the fuse address F_add. Therefore, the decoder 20 may sequentially enable the word lines WL by decoding the fuse address F_add having a value sequentially increasing during the boot-up operation.

The data control circuit 30 may receive the fuse clock F_clk provided from the boot-up control circuit 10 and may output a selection signal Sel_s and a counting code CNT_code. For example, the data control circuit 30 may generate the counting code CNT_code, a code value of which sequentially increases, by counting the fuse clock F_clk and may enable the selection signal Sel_s when the code value of the counting code CNT_code reaches a predetermined code value. When the code value of the counting code CNT_code reaches the predetermined code value, the code value of the counting code CNT_code may be initialized.

The selective input circuit 40 may transfer fuse data F_data to the fuse data register 401 based on the selection signal Sel_s and may transfer a parity signal P_s to the parity data register 501 based on the selection signal Sel_s. For example, the selective input circuit 40 may transfer the fuse data F_data to the fuse data register 401 while the selection signal Sel_s is disabled and may transfer the parity signal P_s to the parity data register 501 while the selection signal Sel_s is enabled.

The fuse array 101 may include a plurality of fuse sets 101-1 and 101-2 and may store therein failed addresses. Each of the plurality of fuse sets 101-1 and 101-2 may be an electrical fuse (E-fuse), in which information is programmed by overcurrent melting of the fuse. The fuse array 101 may output, as the fuse data F_data, information stored in a fuse set selected on a basis of a word line WL enabled by the decoder 20.

The storage circuit 201 may receive and store therein the fuse data F_data based on the counting code CNT_code. The storage circuit 201 may receive and store therein the fuse data F_data until the code value of the counting code CNT_code reaches the predetermined code value. The storage circuit 201 may output the stored information as a storage signal S_s when the code value of the counting code CNT_code reaches the predetermined code value.

The parity circuit 301 may receive the storage signal S_s provided from the storage circuit 201 and may perform a parity operation to the storage signal S_s. The parity circuit 300 may output a result of the parity operation as a parity signal P_s.

The fuse data register 401 may receive and store therein the fuse data F_data provided from the selective input circuit 40. The fuse data register 401 may output the stored information as a fuse register output signal F_r.

The parity data register 501 may receive and store therein the parity signal P_s provided from the selective input circuit 40. The parity data register 501 may output the stored information as a parity register output signal P_r.

The error correction circuit 601 may receive the fuse register output signal F_r provided from the fuse data register 401 and the parity register output signal P_r provided from the parity data register 501. The error correction circuit 601 may correct an error of the fuse register output signal F_r based on the parity register output signal P_r. The error correction circuit 601 may output the error-corrected fuse register output signal F_r as repair information Rep_inf.

Figure 3:
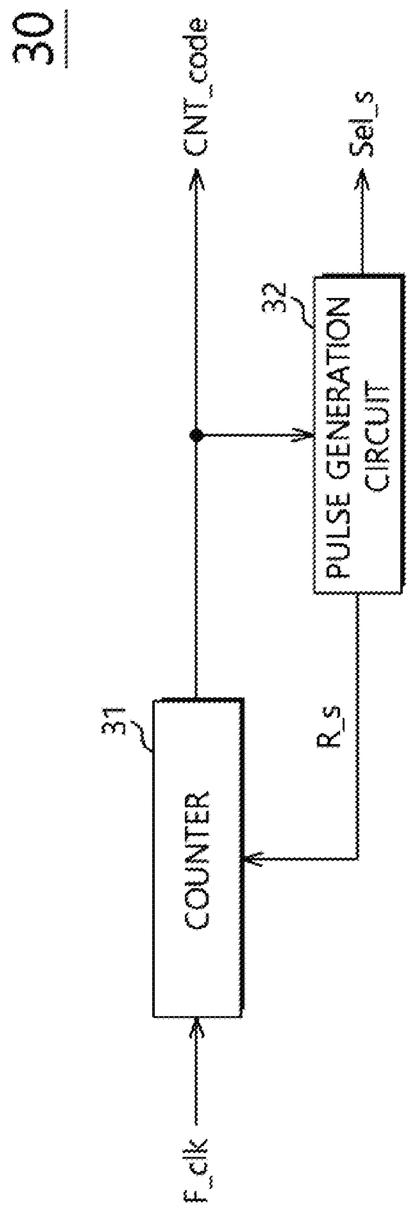
FIG. 3 is a diagram illustrating a configuration of a data control circuit shown in FIG. 2.

FIG. 3 is a diagram illustrating a configuration of the data control circuit 30 shown in FIG. 2.

The data control circuit 30 may include a counter 31 and a pulse generation circuit 32.

The counter 31 may perform a counting operation based on the fuse clock F_clk. The counter 31 may output a result of the counting operation as the counting code CNT_code. The counter 31 may generate the counting code CNT_code, the code value of which sequentially increases and may initialize, when receiving a reset signal R_s, the code value of the counting code CNT_code.

The pulse generation circuit 32 may enable the selection signal Sel_s and the reset signal R_s for a predetermined time when the code value of the counting code CNT_code reaches the predetermined code value. The pulse generation circuit 32 may disable the selection signal Sel_s and the reset signal R_s when the predetermined time elapses after the code value of the counting code CNT_code reaches the predetermined code value.

An operation of the semiconductor apparatus 2000 of such structure in accordance with an embodiment may be as follows.

The boot-up signal B_up may be enabled during the boot-up operation.

When the enabled boot-up signal B_up is provided to the boot-up control circuit 10, the boot-up control circuit 10 may output the fuse address F_add and the fuse clock F_clk. For example, the boot-up control circuit 10 may output the fuse clock F_clk while the boot-up signal B_up is enabled, and may perform the counting operation based on the fuse clock F_clk. The boot-up control circuit 10 may output the result of the counting operation as the fuse address F_add. The fuse address F_add may have a sequentially increasing value.

The decoder 20 may perform the decoding operation based on the fuse address F_add having the sequentially increasing value and may selectively enable word lines WL based on the result of the decoding operation.

The data control circuit 30 may sequentially increase the code value of the counting code CNT_code based on the fuse clock F_clk. When the code value of the counting code CNT_code reaches the predetermined code value, the data control circuit 30 may initialize the code value of the counting code CNT_code and may enable the selection signal Sel_s for the predetermined time.

The fuse array 101 may output, as the fuse data F_data, information stored in a corresponding fuse set based on the enabled word line WL.

The storage circuit 201 may receive and store therein the fuse data F_data until the code value of the counting code CNT_code reaches the predetermined code value, and may output the stored information as the storage signal S_s when the code value of the counting code CNT_code reaches the predetermined code value.

The parity circuit 301 may perform the parity operation to the storage signal S_s, and may output the result of the parity operation as the parity signal P_s.

The selective input circuit 40 may transfer the fuse data F_data to the fuse data register 401 while the selection signal Sel_s is disabled and may transfer the parity signal P_s to the parity data register 501 while the selection signal Sel_s is enabled.

The fuse data register 401 may receive and store therein the signal provided from the selective input circuit 40. The fuse data register 401 may output the stored information as the fuse register output signal F_r.

The parity data register 501 may receive and store therein the signal provided from the selective input circuit 40. The parity data register 501 may output the stored information as the parity register output signal P_r.

The error correction circuit 601 may correct an error of the fuse register output signal F_r based on the parity register output signal P_r and may output the error-corrected fuse register output signal F_r as the repair information Rep_inf.

A detailed operation of the semiconductor apparatus 2000 of such structure in accordance with an embodiment may be as follows.

It is assumed that the parity circuit 301 can perform the parity operation to 64-bit data and the fuse set can store 16-bit data. The data control circuit 30 may increase the code value of the counting code CNT_code based on the fuse clock F_clk, and may initialize the code value of the counting code CNT_code and may enable the selection signal Sel_s for the predetermined time when four periods of the fuse clock F_clk elapse.

The boot-up control circuit 10 may output the fuse clock F_clk and the fuse address F_add during the boot-up operation.

The decoder 20 and the fuse array 101 may select a fuse set based on the fuse address F_add and may output information stored in the selected fuse set as the fuse data F_data. The decoder 20 and the fuse array 101 may output the information, which is stored in four fuse sets during the four periods of the fuse clock F_clk, as the fuse data F_data to the storage circuit 201.

The storage circuit 201 may store, as the fuse data F_data, the information provided from the four fuse sets based on the code value of the counting code CNT_code increased during the four periods of the fuse clock F_clk. The storage circuit 201 may output the stored information as the storage signal S_s to the parity circuit 301 when the code value of the counting code CNT_code reaches the predetermined code value as the four periods of the fuse clock F_clk elapse. Therefore, the fuse data F_data totaling 64 bits, which are provided from the four fuse set, may be provided as the storage signal S_s to the parity circuit 301.

The parity circuit 301 may perform the parity operation to the provided storage signal S_s and may output the result of the parity operation as the parity signal P_s.

The selective input circuit 40 may transfer the fuse data F_data to the fuse data register 401 before the four periods of the fuse clock F_clk elapse, i.e., while the selection signal Sel_s is disabled. Further, the selective input circuit 40 may transfer the parity signal P_s to the parity data register 501 after the four periods of the fuse clock F_clk elapse, i.e., while the selection signal Sel_s is enabled.

Therefore, in accordance with an embodiment, the semiconductor apparatus 2000 may provide the parity circuit 301 with information stored in a predetermined number of fuse sets according to the data processing capacity of the parity circuit 301.

In accordance with an embodiment, the semiconductor apparatus 2000 may increase an operation speed of the repair operation because the fuse array 101 including the electrical fuse (E-fuse) operates slow and therefore all information of the failed addresses programmed in the fuse array 101 can be stored in the fuse data register 401 during the boot-up. Further, repair reliability of the semiconductor apparatus 2000 may be increased because the parity operation is performed to the information of the failed addresses programmed in the fuse array 101 and all the result of the parity operation is stored in the parity data register 500 during the boot-up operation, and the information stored in the fuse data register 401 is error-corrected on a basis of the information stored in the parity data register 500 and the result of the error correction is output as the repair information Rep_inf.

Consequently, in accordance with an embodiment, the semiconductor apparatus 2000 may increase the operation speed and the reliability of the repair operation.

While certain embodiments have been described above, it will be understood to those skilled in the art that the embodiments described are by way of example only. Accordingly, the semiconductor apparatus should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:

a fuse array configured to store information about failed addresses, and to output stored information as fuse data during a boot-up operation;

a storage circuit configured to store the fuse data and to output the stored fuse data as a storage signal;

a parity circuit configured to perform a parity operation based on the storage signal and to output a result of the parity operation as a parity signal;

a fuse data register configured to receive and store therein the fuse data and to output the stored fuse data as a fuse register output signal;

a parity data register configured to receive and store therein the parity signal and to output the stored parity signal as a parity register output signal; and an error correction circuit configured to correct an error of the fuse register output signal based on the parity register output signal and to output the error-corrected signal as repair information.

2. The semiconductor apparatus of claim 1, wherein the fuse array comprises a plurality of fuse sets, wherein each of the plurality of fuse sets comprises electrical fuses.

3. The semiconductor apparatus of claim 1, wherein the storage circuit stores the fuse data, in an amount which is suitable for the parity circuit to perform the parity operation, and outputs the stored fuse data as the storage signal.

4. A semiconductor apparatus comprising:

a boot-up control circuit configured to generate a fuse address and a fuse clock during a boot-up operation;

a fuse array including a plurality of fuse sets in which failed address information is stored, wherein the fuse array is configured to output the failed address information stored in the plurality of fuse sets as fuse data based on the fuse address;

a fuse data register;

a parity data register;

a selective input circuit configured to input the fuse data to the fuse data register or to input a parity signal to the parity data register based on a selection signal;

a storage circuit configured to receive and store therein the fuse data based on a counting code and to output the stored fuse data as a storage signal;

a parity circuit configured to perform a parity operation based on the storage signal and to output a result of the parity operation as the parity signal; and an error correction circuit configured to generate repair information based on an output of the fuse data register and an output of the parity data register.

5. The semiconductor apparatus of claim 4, wherein the boot-up control circuit generates the fuse clock, which periodically transits while a boot-up signal is enabled, and generates the fuse address by counting the fuse clock.

6. The semiconductor apparatus of claim 4, wherein each of the plurality of fuse sets comprises electrical fuses.

7. The semiconductor apparatus of claim 4, wherein the selective input circuit transfers the fuse data to the fuse data register while the selection signal is disabled and transfers the parity signal to the parity data register while the selection signal is enabled.

8. The semiconductor apparatus of claim 4, wherein the storage circuit receives and stores therein the fuse data until a code value of the counting code reaches a predetermined value, and outputs the stored fuse data as the storage signal when the code value of the counting code reaches the predetermined value.

9. The semiconductor apparatus of claim 4, further comprising a data control circuit configured to generate the counting code and the selection signal based on the fuse clock.

10. The semiconductor apparatus of claim 9, wherein the data control circuit generates the counting code based on the fuse clock, and generates the selection signal based on the counting code.

11. The semiconductor apparatus of claim 10, wherein the data control circuit generates the counting code, which is a code value that increases, by counting the fuse clock, and initializes the counting code and enables the selection signal for a predetermined time when the code value of the counting code reaches a predetermined value.

12. The semiconductor apparatus of claim 11, wherein the data control circuit comprises:

a counter configured to generate the counting code based on the fuse clock; and a pulse generation circuit configured to enable a reset signal and the selection signal when the code value of the counting code reaches the predetermined value.

13. The semiconductor apparatus of claim 12, wherein the counter initializes the code value of the counting code when the reset signal is enabled.

* * * * *